United States Patent
Suh et al.

(10) Patent No.: US 8,054,672 B2
(45) Date of Patent: Nov. 8, 2011

(54) NON-VOLATILE MEMORY DEVICE AND METHOD OF OPERATING THE SAME

(75) Inventors: Dong-seok Suh, Seoul (KR); Jun-ho Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1042 days.

(21) Appl. No.: 11/980,357

(22) Filed: Oct. 31, 2007

(65) Prior Publication Data

US 2008/0158940 A1 Jul. 3, 2008

(30) Foreign Application Priority Data

Dec. 29, 2006 (KR) .......................... 10-2006-0138860

(51) Int. Cl.
*G11C 11/00* (2006.01)
(52) U.S. Cl. ........................................ 365/148; 977/754
(58) Field of Classification Search .................... 365/46, 365/94, 100, 113, 129, 148, 163; 257/2–5, 257/9, 296, E31.047, E27.006; 438/29, 95, 438/96, 166, 259, 365, 482, 486, 597; 977/754
See application file for complete search history.

(56) References Cited

U.S. PATENT DOCUMENTS

| 5,534,711 A * | 7/1996 | Ovshinsky et al. ............... 257/3 |
| 6,795,338 B2 * | 9/2004 | Parkinson et al. ............ 365/163 |
| 2008/0273378 A1 * | 11/2008 | Philipp et al. ................. 365/163 |

* cited by examiner

*Primary Examiner* — Richard Elms
*Assistant Examiner* — Harry W Byrne
(74) *Attorney, Agent, or Firm* — Harness, Dickey & Pierce, P.L.C.

(57) ABSTRACT

Provided are a non-volatile memory device and a method of operating the non-volatile memory device. The non-volatile memory device includes a switching device and a storage node connected to the switching device, wherein the storage node comprises: a first electrode connected to the switching device; a chalcogenide material layer formed on the first electrode; and a second electrode formed on the chalcogenide material layer, and one of the first and second electrodes comprises an electrode contact layer formed adjacent to a limited region of the chalcogenide material layer, and a property of the electrode region adjacent to the chalcogenide material layer is changed reversibly according to the direction in which a current is applied, thereby changing between a high resistance state and a low resistance state.

11 Claims, 4 Drawing Sheets

NON-VOLATILE MEMORY DEVICE AND METHOD OF OPERATING THE SAME

CROSS-REFERENCE TO RELATED PATENT APPLICATION

This application claims the benefit of Korean Patent Application No. 10-2006-0138860, filed on Dec. 29, 2006 in the Korean Intellectual Property Office, the disclosure of which is incorporated herein in its entirety by reference.

BACKGROUND OF THE INVENTION

1. Field of the Invention

The present invention relates to a non-volatile memory device and a method of operating the non-volatile memory device, and more particularly, to a non-volatile memory device using a change in resistance in a junction portion between a metal electrode and a chalcogenide material layer, and a method of operating the non-volatile memory device.

2. Description of the Related Art

Examples of non-volatile memory devices using a change in resistance in a junction portion between a metal electrode and a chalcogenide material layer are a phase change random access memory (PRAM) and a conducting bridge memory (CBRAM).

A CBRAM stores information by repeatedly forming and removing a conductive path in the chalcogenide material. The conductive path is formed by diffusing a metal electrode material diffused into a chalcogenide material.

In the PRAM, a chalcogenide material contacting a conductive electrode creates phase changes between crystalline and amorphous phases.

However, the problem of the PRAM is that the amorphous phase storing information is crystallized at a high temperature, and the problem of the CBRAM is that a conductive bridge is destroyed at a high temperature due to activated movement of atoms. Thus the PRAM and CBRAM have low reliability at high temperatures.

SUMMARY OF THE INVENTION

The present invention provides a non-volatile memory device using a change in resistance in a junction portion between a metal electrode and a chalcogenide material layer to realize information storage states without being affected by high temperatures, and a method of operating the non-volatile memory device.

According to an aspect of the present invention, there is provided a non-volatile memory device comprising a switching device and a storage node connected to the switching device, wherein the storage node comprises: a first electrode connected to the switching device; a chalcogenide material layer formed on the first electrode; and a second electrode formed on the chalcogenide material layer, and one of the first and second electrodes comprises an electrode contact layer formed adjacent to a limited region of the chalcogenide material layer, and a property of the electrode region adjacent to the chalcogenide material layer is changed reversibly according to the direction in which a current is applied, thereby changing between a high resistance state and a low resistance state.

The high resistance state may be obtained when applying a pulse current to the chalcogenide material layer from the electrode contact layer; and the low resistance state may be obtained when applying a pulse current to the electrode contact layer from the chalcogenide material layer.

The adjacent electrode region near the chalcogenide material layer of the electrode contact layer may become porous when applying a pulse current to the chalcogenide material layer from the electrode contact layer to be changed to a high resistance state, and become dense conductive when applying a pulse current to the electrode contact layer from the chalcogenide material layer to be changed to a low resistance state.

A pulse current may be applied from the electrode contact layer to the chalcogenide material layer during write programming, and a pulse current may be applied from the chalcogenide material layer to the electrode contact layer during erase programming.

The chalcogenide material layer may have a crystallization state both during writing and erase programming.

The chalcogenide material layer may comprise one selected from the group consisting of Ge—Sb—Te, Ge—Te, Sb—Te, Bi—Te, In—Te, Pb—Te, Ag—In—Sb—Te Ge—As—Te, and Se—Te.

The electrode contact layer may be formed of one selected from the group consisting of Ti—N, Ta—N, Ti—Si—N, and Ti—Si—C or an alloy comprising one selected from the group consisting of Ti—N, Ta—N, Ti—Si—N, and Ti—Si—C.

According to another aspect of the present invention, there is provided a method of operating a non-volatile memory device comprising a switching device and a storage node connected to the switching device and comprising a first electrode, a chalcogenide material layer formed on the first electrode, and a second electrode formed on the chalcogenide material layer, and one of the first and second electrodes includes an electrode contact layer formed to contact a limited region of the chalcogenide material layer, the method comprising: forming a high resistance state by applying a current to the chalcogenide material layer from the electrode contact layer; and forming a low resistance state by applying a current to the electrode contact layer from the chalcogenide material layer.

A region of the electrode contact adjacent to the chalcogenide material layer may become porous when applying a pulse current to the chalcogenide material layer from the electrode contact layer, thereby forming a high resistance state, and the region of the electrode contact layer adjacent to the chalcogenide material layer may become a dense conductive material when applying a pulse current to the electrode contact layer from the chalcogenide material layer, thereby forming a low resistance state.

A pulse current may be applied from the electrode contact layer to the chalcogenide material layer during write programming, and a pulse current may be applied from the chalcogenide material layer to the electrode contact layer during erase programming.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
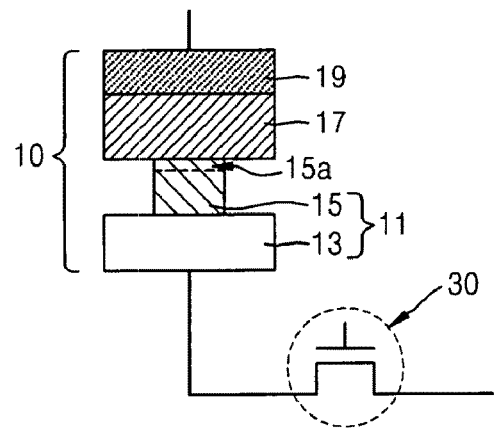
FIG. 1 is a schematic view of a non-volatile memory device according to an embodiment of the present invention.

FIG. 1 is a schematic view of a non-volatile memory device according to an embodiment of the present invention.

Referring to FIG. 1, the non-volatile memory device includes a storage node 10 and a switching device 30 connected to the storage node 10. The switching device 30 is preferably a field effect transistor, but may also be a transistor, a PN diode, or a bipolar junction transistor. The switching device 30 may be one of various switching devices having various structures that are known in the field of memory devices.

The storage node 10 includes a first electrode 11 connected to the switching device 30, a chalcogenide material layer 17 formed on the first electrode 11, and a second electrode 19 formed on the chalcogenide material layer 17.

The first electrode 11 includes an electrode contact layer 15 which contacts a limited region of the chalcogenide material layer 17. Also, the first electrode 11 further includes a bottom electrode 13 which also functions as a pad layer providing a wide region in which the electrode contact layer 15 can be formed. The bottom electrode 13 of the storage node 10 is connected to the switching device 30, for example, to a source region of a transistor, via a conductive plug (not shown).

When the first electrode 11 includes the electrode contact layer 15 contacting a limited region of the chalcogenide material layer 17, the second electrode 19 functions as a top electrode, and is formed on the chalcogenide material layer 17 over a wider region than the electrode contact layer 15.

On the other hand, the second electrode 19 may include an electrode contact layer contacting a limited region of the chalcogenide material layer 17. Then the second electrode 19 includes the electrode contact layer and a top electrode that is formed over a wider region than the electrode contact layer, and the first electrode 11 is formed of only a bottom electrode that is formed over a wider region than the electrode contact layer. Such modifications can be induced from the above description and FIG. 1, and illustrations and description thereof will be omitted.

The chalcogenide material layer 17 may be formed of one selected from the group consisting of Ge—Sb—Te, Ge—Te, Sb—Te, Bi—Te, In—Te, Pb—Te, Ag—In—Sb—Te Ge—As—Te, and Se—Te.

Also, the electrode contact layer 15 may be formed of one selected from the group consisting of Ti—N, Ta—N, Ti—Si—N, and Ti—Si—C, or of an alloy including one selected from the group consisting of Ti—N, Ta—N, Ti—Si—N, and Ti—Si—C. The bottom electrode 13 of the first electrode 11 and the top electrode of the second electrode 19 may be formed of, for example, Ti.

The non-volatile memory device according to an embodiment of the present invention changes between a high resistance state and a low resistance state as the property of a region near the chalcogenide material layer 17 of the electrode contact layer 15 (hereinafter, "adjacent electrode region 15a") changes reversibly according to the applying direction of current. A dotted line in FIG. 1 denotes the adjacent electrode region 15a which changes between the high resistance state and the low resistance state according to the direction in which a current is applied, as described above.

Figure 2:
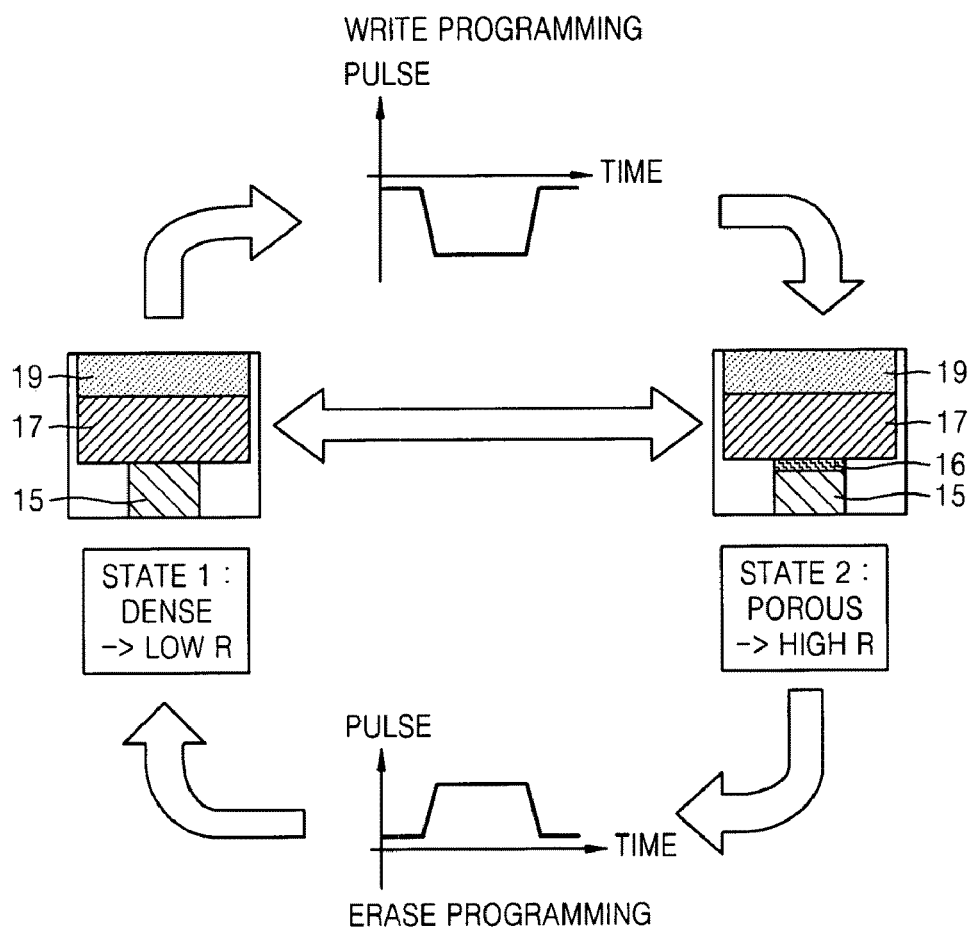
FIG. 2 illustrates reversible changes of an adjacent electrode region changing into a porous region or into a dense conductive material as it was previously, according to the applying direction of a pulse current.

The high resistance state is obtained when applying a current, preferably a pulse current, to the chalcogenide material layer 17 from the electrode contact layer 15, and the low resistance state is obtained when applying a current, preferably a pulse current, to the electrode contact layer 15 from the chalcogenide material layer 17, as illustrated in FIG. 2.

Figure 3A:
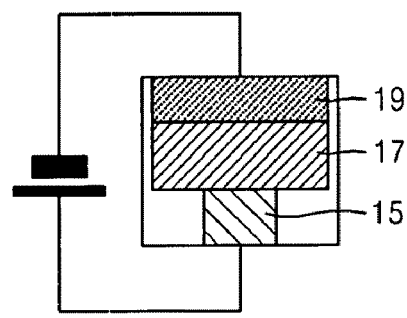
FIG. 3A illustrates an equivalent circuit when a pulse current is applied to a chalcogenide material layer from an electrode contact layer, during write programming.
Figure 3B:
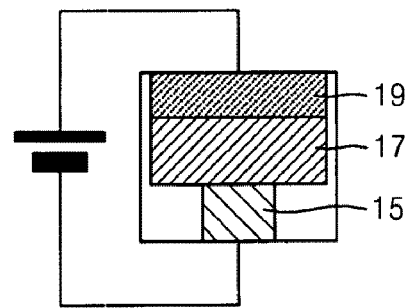
FIG. 3B illustrates an equivalent circuit when a pulse current is applied to an electrode contact layer from a chalcogenide material layer, during erase programming.
Figure 4:
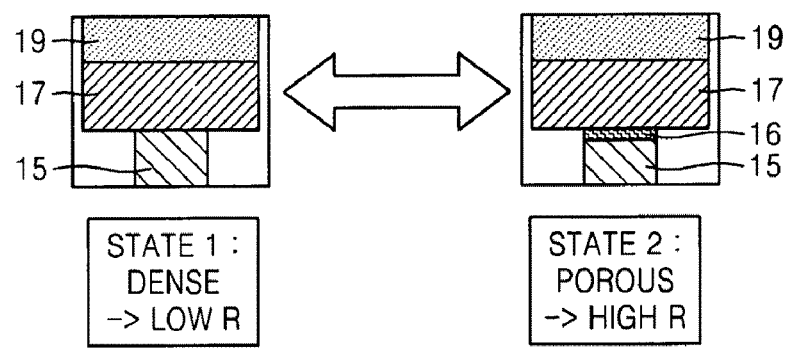
FIG. 4 shows the information storages states of a non-volatile memory device according to an embodiment of the present invention, comparing storages nodes in states 1 and 2 in FIG. 2.

FIG. 2 illustrates reversible changes of the adjacent electrode region 15a changing into a porous region 16 or into a dense conductive material as it was previously, according to the applying direction of a pulse current. FIG. 3A illustrates an equivalent circuit when a pulse current is applied to the chalcogenide material layer 17 from the electrode contact layer 15, during write programming. FIG. 3B illustrates an equivalent circuit when a pulse current is applied to the electrode contact layer 15 from the chalcogenide material layer 17, during erase programming. FIG. 4 shows the state of the information storage of the non-volatile memory device according to the present invention, comparing storages nodes in states 1 and 2 in FIG. 2.

The direction, in which the pulse current is applied, can be converted by changing the polarity of the pulse current, as can be seen from the pulse current illustrated in FIG. 2.

When a pulse current is applied to the chalcogenide material layer 17 from the electrode contact layer 15, during write programming, the adjacent electrode region 15a becomes a porous region, as illustrated with respect to the state 2 of the storage node 10 in FIGS. 2 and 4. The porous region 16 has a high resistance.

Figure 5A:
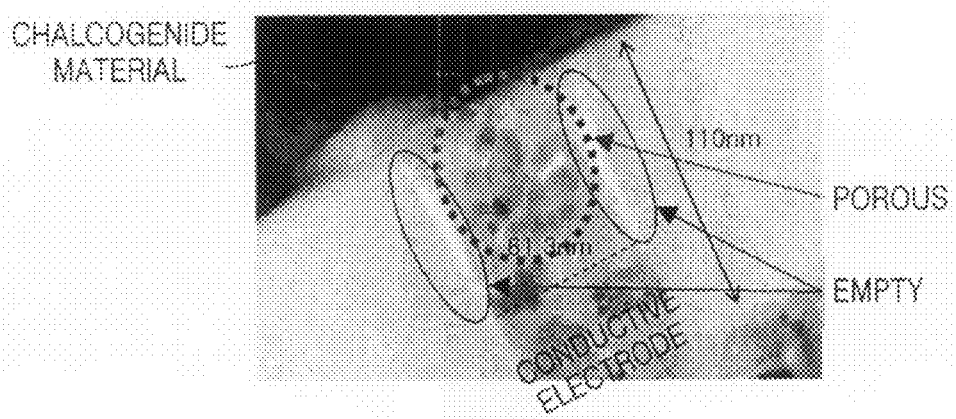
FIG. 5A is a photographic image of an adjacent electrode region that is porous when a pulse current is applied to a chalcogenide material layer from an electrode contact layer.

The porous adjacent electrode region 15a can be seen in a photographic image of FIG. 5A, where the adjacent electrode region 15a is porous, and both sides of the adjacent electrode region 15a are separated from regions (regions formed of insulating material) at both sides of the electrode contact layer 15 thus forming an empty space therebetween.

As described above, the reason why the adjacent electrode region 15a is porous when a pulse current is applied to the chalcogenide material layer 17 from the electrode contact layer 15, is that the chalcogenide material forming the chalcogenide material layer 17 absorbs metal well. In other words, this is because metal diffuses easily into the chalcogenide material layer 17.

Accordingly, when a pulse current is applied to the chalcogenide material layer 17 from the electrode contact layer 15, the adjacent electrode region 15a of the electrode contact layer 15 may be formed to have a high resistance state, and this state is regarded as indicating that a data bit 1 is recorded to the storage node 10 by write programming.

Figure 5B:
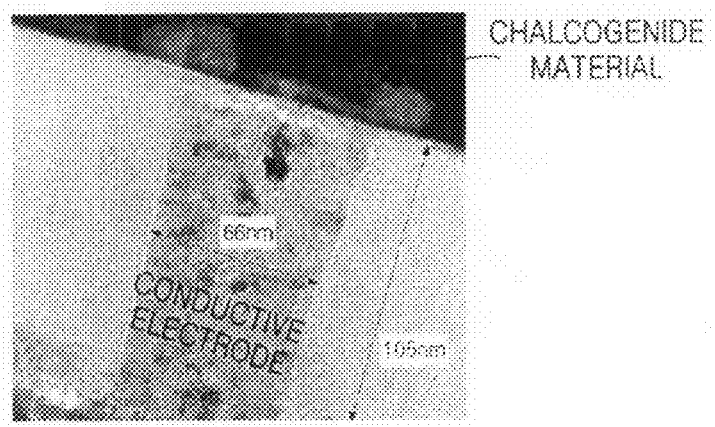
FIG. 5B is a photographic image of an adjacent electrode region that is dense and conductive like the other region of the electrode contact layer when a pulse current is applied to a chalcogenide material layer.

The other way around, when a pulse current is applied from the chalcogenide material layer 17 to the electrode contact layer 15, during erase programming, the adjacent electrode region 15a that is near the chalcogenide material layer 17 of the electrode contact layer 15 becomes a dense conductive material like the rest of the region of the electrode contact layer 15 due to erasing of the porous region 16 as illustrated with respect to state 1 of the storage node 10 in FIGS. 2 and 4. Thus the adjacent electrode region 15a has a low resistance. The dense conductive material state of the adjacent electrode region 15a can be seen in a photographic image of FIG. 5B.

As described above, when a pulse current is applied from the chalcogenide material layer 17 to the electrode contact layer 15, the reason that the adjacent electrode region 15a is formed of a dense conductive material (the reason that the porous region 16 is erased) is that metal can easily move from the chalcogenide material layer 17 to the electrode contact layer 15.

Accordingly, when a pulse current is applied from the chalcogenide material layer 17 to the electrode contact layer 15, the adjacent electrode region 15a of the electrode contact layer 15 may be formed to have a low resistance state, and this state is regarded as indicating that a data bit 0 is recorded to the storage node 10 by erase programming.

Since the width of the electrode contact layer 15 is narrow, the temperature of the adjacent electrode region 15a is greatly raised to high temperature during write or erase programming. Accordingly, the metal is easily moved from the electrode contact layer 15 to the chalcogenide material layer 17 according to the direction in which the pulse current is applied to make the adjacent electrode region 15a porous, or the metal is easily moved from the chalcogenide material layer to the electrode contact layer 15 to erase the porous region 16 into a dense conductive material state.

Thus the adjacent electrode region 15a can be reversibly changed between a high resistance state and a low resistance state according to the direction of a pulse current. Accordingly, a data bit 0 or 1 can be recorded in the storage node 10 by changing the direction of the pulse current applied to the storage node 10.

Here, even though the direction of the pulse current is changed, the property of the chalcogenide material layer 17 is not changed as much as to affect the value of the data bit. For example, the chalcogenide material layer 17 stays crystallized.

Meanwhile, information stored in the non-volatile memory device according to the current embodiment of the present invention reads out by estimating whether or not a measured resistance is large when a small bias current, which is so small that the properties of the adjacent electrode region 15a of the electrode contact layer 15 are not changed, is applied to the storage node 10, to read out the data bit recorded in the storage node 10.

The retention characteristics of the non-volatile memory device according to the current embodiment of the present invention will now be described.

Figure 6:
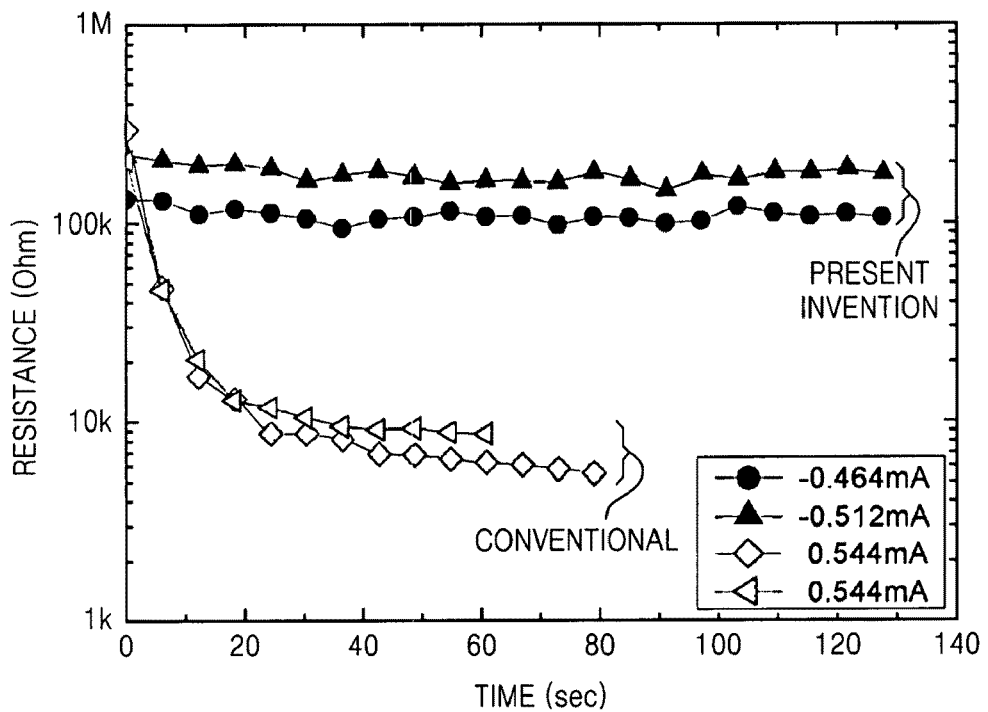
FIG. 6 is a graph showing the retention characteristics of a non-volatile memory device at environmental temperature of 170° C. after write programming, according to an embodiment of the present invention, compared to the retention characteristics of a typical phase change random access memory (PRAM), which is a comparison example.
Figure 7A:
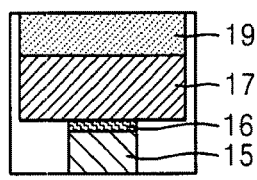
FIG. 7A shows an adjacent electrode region of an electrode contact layer that is made porous by performing write programming on a storage node of a non-volatile memory device according to an embodiment of the present invention.
Figure 7B:
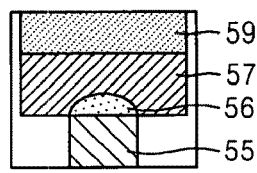
FIG. 7B is a comparison example showing that a portion of a phase change layer adjacent to an electrode contact layer is made amorphous by performing write programming on a storage node of a typical PRAM.

FIG. 6 is a graph showing the retention characteristics of the non-volatile memory device at environmental temperature of 170° C. after write programming, compared to the retention characteristics of a typical phase change random access memory (PRAM) which is a comparison example. FIG. 7A shows an adjacent electrode region of the electrode contact layer 15 that is made porous by performing write programming on the storage node 10 of the non-volatile memory device; and FIG. 7B is a comparison example showing that a portion of a phase change layer 57 adjacent to an electrode contact layer 55 is changed into an amorphous region 56 by performing write programming on a storage node 50 of a typical PRAM.

The retention characteristics of the non-volatile memory device according to the present invention illustrated in FIG. 6 are with respect to a sample in which the electrode contact layer 15, the chalcogenide material layer 17, and the top electrode of the storage node 10 are respectively formed of TiAlN, $Ge_2Sb_2Te_5$, and Ti. Also, the retention characteristics of the typical PRAM illustrated in FIG. 6 are with respect to a sample in which an electrode contact layer 55, a phase change layer 57, and a top electrode 59 of a storage node 50 in FIG. 7B are formed of the same materials as the electrode contact layer 15, the chalcogenide material layer 17, and the top electrode of FIG. 7A.

As is well known in the art, in the typical PRAM, during write programming, a phase transition current is applied from the top electrode 59, via the phase change layer 57, and to the electrode contact layer 15 to change a portion of the phase change layer 57 adjacent to the electrode contact layer 15 into an amorphous state to record a data bit 1. Also, during erase programming, a reduced current is applied in the same direction as in the write programming, for a prolonged time, to change the amorphous region of the phase change layer into a crystalline state, thus recording a data bit 0.

Accordingly, in the typical PRAM, crystallization of the amorphous region 56 occurs at a high temperature environment, and thus the resistance cannot be maintained properly.

On the other hand, according to the non-volatile memory device according to the present invention, the porosity of the porous region 16 formed in the electrode contact layer 15 of the storage node 10 is maintained under a high temperature environment, thereby maintaining the resistance.

This can be seen in FIG. 6. Referring to FIG. 6, the non-volatile memory device according to the present invention has good retention, maintaining a high resistance state at a high temperature compared to the typical PRAM that is formed of the same material.

As described above, according to the non-volatile memory device and the method of operating the non-volatile memory device of the present invention, a typical conducting bridge memory (CBRAM) stores information by repeatedly creating and erasing a conductive path in the chalcogenide material as a metal electrode material is diffused into the chalcogenide material and erasing the conductive path. However, according to the present invention, the state of the adjacent electrode region 15a of the electrode contact layer (conductive electrode) 15 has the property of a metal, and then the portion becomes porous, thereby having a high resistance, and the chalcogenide material maintains the conductive state from the start.

Also, while the typical PRAM stores information by changing the resistance as the chalcogenide material in contact with a conductive electrode undergoes a phase change between a crystalline state and an amorphous state, according to the present invention, a state of an adjacent electrode region of a conductive electrode is changed, and there is no phase change of the chalcogenide material.

As described above, according to the present invention, the electrode region adjacent to the chalcogenide material of the conductive electrode becomes porous, which denotes a high resistance, or becomes dense conductive state, which denotes a low resistance, according to the direction in which a current is applied, without a phase change of the chalcogenide material.

Accordingly, the chalcogenide material does not change from an amorphous state to a crystalline state at a high temperature environment, and even when the porous conductive electrode experiences a high temperature, the porosity of the electrode is maintained, and thus information storage is not affected by the high temperature.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A non-volatile memory device comprising a switching device and a storage node connected to the switching device, wherein the storage node comprises:
    a first electrode connected to the switching device;
    a chalcogenide material layer formed on the first electrode; and
    a second electrode formed on the chalcogenide material layer, and
    one of the first and second electrodes comprises an electrode contact layer formed adjacent to a limited region of the chalcogenide material layer, and a property of the electrode region adjacent to the chalcogenide material layer is changed reversibly according to the direction in which a current is applied, thereby changing between a high resistance state and a low resistance state without a phase change of the chalcogenide material layer.

2. The non-volatile memory device of claim 1, wherein the high resistance state is obtained when applying a pulse current to the chalcogenide material layer from the electrode contact layer; and the low resistance state is obtained when applying a pulse current to the electrode contact layer from the chalcogenide material layer.

3. The non-volatile memory device of claim 1, wherein the adjacent electrode region near the chalcogenide material layer of the electrode contact layer becomes porous when applying a pulse current to the chalcogenide material layer from the electrode contact layer to be changed to a high resistance state, and becomes dense conductive when applying a pulse current to the electrode contact layer from the chalcogenide material layer to be changed to a low resistance state.

4. The non-volatile memory device of claim 3, wherein a pulse current is applied from the electrode contact layer to the chalcogenide material layer during write programming, and a pulse current is applied from the chalcogenide material layer to the electrode contact layer during erase programming.

5. The non-volatile memory device of claim 4, wherein the chalcogenide material layer has a crystallization state both during writing and erase programming.

6. The non-volatile memory device of claim 1, wherein the chalcogenide material layer comprises one selected from the group consisting of Ge—Sb—Te, Ge—Te, Sb—Te, Bi—Te, In—Te, Pb—Te, Ag—In—Sb—Te Ge—As—Te, and Se—Te.

7. The non-volatile memory device of claim 6, wherein the electrode contact layer is formed of one selected from the group consisting of Ti—N, Ta—N, Ti—Si—N, and Ti—Si—C or an alloy comprising one selected from the group consisting of Ti—N, Ta—N, Ti—Si—N, and Ti—Si—C.

8. The non-volatile memory device of claim 1, wherein the electrode contact layer is formed of one selected from the group consisting of Ti—N, Ta—N, Ti—Si—N, and Ti—Si—C or an alloy comprising one selected from the group consisting of Ti—N, Ta—N, Ti—Si—N, and Ti—Si—C.

9. A method of operating a non-volatile memory device comprising a switching device and a storage node connected to the switching device and comprising a first electrode, a chalcogenide material layer formed on the first electrode, and a second electrode formed on the chalcogenide material layer, and one of the first and second electrodes includes an electrode contact layer formed to contact a limited region of the chalcogenide material layer, the method comprising:
    forming a high resistance state by applying a current to the chalcogenide material layer from the electrode contact layer without a phase change of the chalcogenide material layer; and
    forming a low resistance state by applying a current to the electrode contact layer from the chalcogenide material layer without a phase change of the chalcoenide material layer.

10. The method of claim 9, wherein a region of the electrode contact adjacent to the chalcogenide material layer becomes porous when applying a pulse current to the chalcogenide material layer from the electrode contact layer, thereby forming a high resistance state, and the region of the electrode contact layer adjacent to the chalcogenide material layer becomes a dense conductive material when applying a pulse current to the electrode contact layer from the chalcogenide material layer, thereby forming a low resistance state.

11. The method of claim 10, wherein a pulse current is applied from the electrode contact layer to the chalcogenide material layer during write programming, and a pulse current is applied from the chalcogenide material layer to the electrode contact layer during erase programming.

* * * * *